United States Patent [19]

Rooz et al.

[11] 3,882,816

[45] May 13, 1975

[54] APPARATUS FOR FORMING LAYERS OF FUSIBLE METAL ON ARTICLES

[75] Inventors: David L. Rooz, Allentown; Ford J. Brown, Kutztown; Richard J. Merwarth, Easton, all of Pa.

[73] Assignee: Western Electric Co., Inc., New York, N.Y.

[22] Filed: Sept. 22, 1972

[21] Appl. No.: 291,482

[52] U.S. Cl. .................. 118/57; 118/211; 118/221; 118/228; 118/239; 118/66

[51] Int. Cl. .......................... B05c 1/02; B05c 11/12

[58] Field of Search ........... 118/219, 224, 221, 227, 118/239, 228, 426, 58, 57, 66, 211, DIG. 20; 198/33 AC, 131; 134/1; 228/33, 35

[56] References Cited

UNITED STATES PATENTS

| | | | |
|---|---|---|---|
| 1,369,450 | 2/1921 | Manss | 118/227 |
| 2,382,236 | 8/1945 | Laxo | 118/239 X |
| 2,674,224 | 4/1954 | McKay | 118/239 X |
| 2,716,620 | 8/1955 | Green et al. | 118/66 X |
| 2,912,398 | 11/1959 | Johnson et al. | 118/249 X |
| 2,940,419 | 6/1960 | Anderson et al. | 118/219 |
| 2,952,567 | 9/1960 | Nordquist et al. | 198/33 AC |
| 3,073,323 | 1/1963 | Rand | 134/1 X |
| 3,323,492 | 6/1967 | Mellar et al. | 118/426 X |
| 3,563,203 | 2/1971 | Stiltner | 118/324 |

OTHER PUBLICATIONS

"Bead Chain Orienting Conveyor," Western Electric Technical Digest, No. 34, October 1971, Brown et al.

*Primary Examiner*—John P. McIntosh
*Attorney, Agent, or Firm*—R. Y. Peters

[57] ABSTRACT

In fabricating sealed contacts, often their axially extending leads are solder coated to protect them from contamination and to enhance their solderability into circuits. An apparatus for solder coating the leads, which minimizes their bending, includes a conveying apparatus that moves the contacts through various stages of the solder coating apparatus to form layers of solder on the leads. These layers, which are carefully controlled, are no greater than a certain maximum thickness, and are thinner on the ends of the leads than on the side surfaces thereof.

To coat the leads, the contacts are individually mounted in a plurality of holders, each of which is fixed to an individual bead of an endless chain of the conveying apparatus. As the chain is advanced through a passageway of a tube having various curvilinear and rectilinear slots formed in the outer surface thereof, the holders extending through these slots are oriented in various longitudinal positions along the tube and angular positions about the chain to appropriately orient the leads through the stages of the solder coating apparatus.

In a first stage, the contacts are loaded into the holders from a bin and moved in a predetermined orientation to second stage where a mixture of powdered solder and flux is applied to each lead by coating wheels having resilient peripheral surfaces. The leads are moved into simultaneous contact with these surfaces to coat the side surfaces and ends of the lead with the mixture. Next the leads are moved in the same angular orientation by the chain through a heating apparatus having a baffle arrangement to substantially confine hot gases to the vicinity of the leads to melt the solder of the mixture. The chain then moves the solder coated leads longitudinally along the tube and rotatably about the chain due to the camming action of the slots on the holders. This changes the angular orientation of the leads and immerses the contacts and leads in a clenching bath to remove any residual flux from the leads. The contacts are next rotatably and longitudinally moved out of the cleaning bath and into a rinsing bath. Finally, the contacts are moved through a drying chamber to remove any remnants of the rinsing bath and are stripped from the holders into a bin.

13 Claims, 10 Drawing Figures

APPARATUS FOR FORMING LAYERS OF FUSIBLE METAL ON ARTICLES

BACKGROUND OF THE INVENTION

1. Field of the Invention

This invention relates to apparatus for forming layers of fusible metal on articles, and more particularly to apparatus for solder coating, conveying, and heating wire-like members and positioning them in various treating mediums.

2. Description of the Prior Art

This invention is particularly suited for use in the manufacture of electrical components having elongated bodies and axially extending leads, such as sealed contacts. A sealed contact of the dry-reed type, sometimes referred to as a "dry-reed switch," includes two flexible magnetic leads sealed into an elongated glass envelope. Each lead has a terminal portion extending out of an end of the envelope and a contact portion extending from such end into the envelope, so that the internal contact portions of the leads overlap axially, but are spaced transversely a small distance to establish a gap therebetween.

While this invention is adapted for forming layers of metals on a variety of different articles and for solder coating, conveying, heating and positioning them, it will be particularly described with respect to an article having an elongated body and a pair of leads extending axially from each end, such as a sealed contact. However, it is to be understood that other articles, such as resistors, diodes, etc., may have metals formed on them, or may be solder coated, conveyed, heated and positioned, in accordance with this invention.

After a sealed contact has been fabricated, it is often necessary to coat the axially extending leads with solder to protect them from contamination and enhance their solderability into circuits. Certain difficulties have been encountered with the prior art techniques.

For example, in barrel plating of sealed contacts, often the leads have been bent and metal has been plated over contaminants on the leads. This interferes with the subsequent handling and assembling of the contacts with automatic equipment. While the leads may not be as readily bent in rack plating, still metal has often been plated over contaminants.

In dip and wave solder coating, the glass envelopes have often been subjected to thermoshock, damaging the glass envelopes. With these coating techniques, there is also inadequate control over the thickness of the coating on the leads.

Moreover, when the contacts are inserted into printed circuit boards, their gaps must be aligned within certain limits. Accordingly, it is desirable to have not only a controlled thickness of solder on the side surfaces of the leads, but also on the ends of the leads. Solder spikes on the ends of the leads, such as those caused by dip and wave soldering, cannot be tolerated.

In solder coating these leads, it is also desirable to not only minmize the heat applied to the sealed contacts but also to the article handling mechanisms to prevent heat damage to the glass envelopes as well as these mechanisms. In other words, to the greatest extent possible it is desirable to concentrate the heat on the leads.

It is also desirable to minimize the contact between a treating medium, such as a cleaning bath, and these mechanisms. The reason is that the medium may damage the mechanisms or interfere with their lubricants, and the mechanisms and lubricants may tend to increase the contamination of the treating medium. By minimizing this contact, especially if the medium is a liquid, any drag out of the treating medium is also reduced.

After the solder coating of the leads, it is desirable to remove any residual flux from the leads, since it may interfere with subsequent electrical contact to the leads. To do this, both longitudinal and angular control of the leads through the various treating mediums, such as a cleaning bath, is desirable. Preferably, this control should be effectuated with a simple mechanism that minimizes article handling. Minimizing such handling tends to reduce the likelihood of not only mechanical damage but also electrical damage to the contacts.

Finally, it is also desirable to effectuate the solder coating at great speeds to increase the output of the solder coating facilities.

SUMMARY OF THE INVENTION

It is, therefore, an object of this invention to provide new and improved apparatus for forming layers of a fusible metal on articles.

Another object of this invention is the provision of apparatus for solder coating, conveying and heating wire-like members, and positioning them in various treating mediums.

With these and other objects in view, the present invention contemplates a new apparatus for forming layers of a fusible metal on articles, which includes facilities for applying a mixture of the metal and a flux on each article. The apparatus also includes an elongated member having a surface and a slot formed in the surface of the member and extending longitudinally therealong. Facilities extending through the slot are provided for mounting each article to a strand-like member. Also provided are facilities for heating at least the fusible metal of the mixture to melt it and a mechanism for advancing the strand-like member along the elongated member. The advancement of the strandlike member moves the mounting facilities longitudinally along the slot to convey each article through the applying facility to apply the mixture on each article, and to convey each article with the mixture thereon through the heating facilities to melt the fusible metal of the mixture and thereby form layers of the fusible metal on the articles.

BRIEF DESCRIPTION OF THE DRAWINGS

Other objects and advantages of the present invention may be more clearly understood by reference to the following detailed description of the drawings, wherein.

DETAILED DESCRIPTION

SEALED CONTACT

Figure 1:
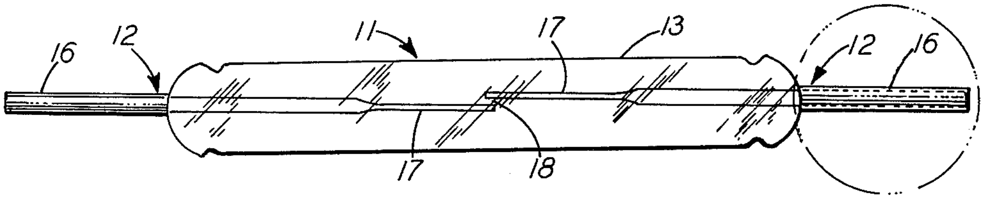
FIG. 1 is an enlarged front elevational view, of a sealed contact, the axially extending leads of which have been solder coated in accordance with the present invention.

Referring now to the drawings and in particular to FIG. 1, there is shown a typical sealed contact, designated generally by the numeral 11, such as that used in the communications industry. The sealed contact 11 includes a pair of flexible magnetic wire-like members or leads, designated generally by the numeral 12, sealed into the opposite ends of an elongated glass envelope 13. Each lead 12 has a terminal portion 16 extending out of each end of the envelope 13. Each lead 12 also has a contact portion 17 extending from each end into the envelope 13 so that the contact portions 17 of the leads 12 overlap axially but are spaced transversely a small distance to establish a gap 18 therebetween.

Figure 2:
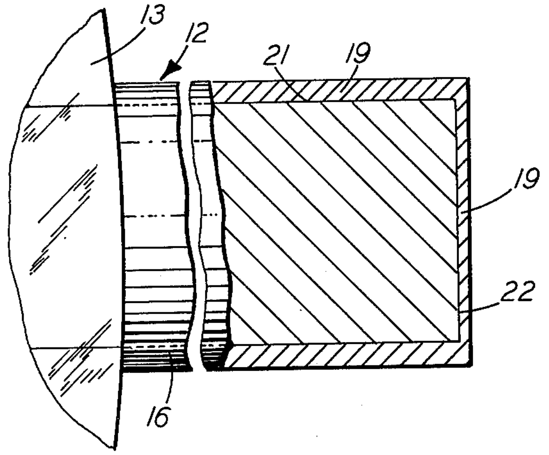
FIG. 2 is a greatly enlarged view of the portion of the sealed contact of FIG. 1 enclosed in a phantom circle, illustrating the thickness of solder that has been coated on the side surfaces and ends of the leads of the sealed contacts.

The apparatus of the present invention forms layers 19 (FIG. 2) of a fusible metal such as solder on the side surfaces 21 and ends 22 of the terminal portions 16 of the leads 12. These layers 19 not only protect the leads 12 but enhance their solderability into circuits (not shown). It is important that the thickness of the layers 19 on the ends 22 be carefully controlled so that the gaps 18 of the contacts 11 are aligned within certain limits when the contacts 11 are inserted into printed circuit boards (not shown). It is also important that the thickness of the layers 19 on the side surfaces 21 be carefully controlled so that the leads 12 can be inserted into apertures of the printed circuit boards. These layers 19 cannot exceed a certain maximum thickness. Typically, the layers 19 cannot exceed 2 mils on the side surfaces 21 and 3 mils on the ends 22. Using the apparatus of the present invention, the layers 19 are usually formed with a thickness of about 1 mil on the surfaces 21 and about ½ mil on the ends 22. These proportions are shown in FIG. 2.

OVERALL SOLDER COATING APPARATUS

Figure 3:
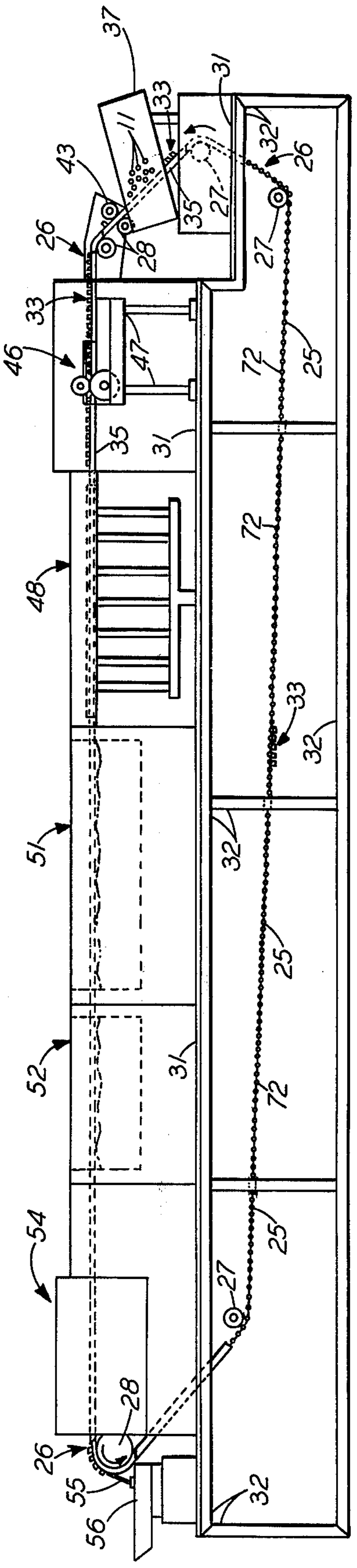
FIG. 3 is a side elevational view of the overall apparatus of the present invention for forming layers of solder on the leads of the sealed contacts.

Referring now to FIG. 3, an overall apparatus is shown for forming the layers 19 on the side surfaces 21 and ends 22 of the terminal portions 16 of the leads 12 of a plurality of the sealed contacts 11. Although the layers 19 are typically formed of a fusible metal such as solder, it is to be understood that it is within the spirit and scope of this invention to form the layers 19 of other materials or metals.

The overall apparatus of FIG. 3 includes an endless strand-like member or bead chain 25 of a conveying apparatus, designated generally by the numeral 26. The chain 25 is mounted on a plurality of idler sprockets 27 and drive sprockets 28. The sprockets 27 and 28 are appropriately mounted to a base 31 and a conventional supporting structure 32 formed of, for example, angle iron.

The endless bead chain 25 is driven by the sprockets 28 in a counterclockwise direction, as indicated by the arrows in FIG. 3. As it is driven, the chain 25 moves through an enclosure or a passageway 34 (shown in greater detail in FIGS. 4 and 6) of an elongated member with a curvilinear outer surface or a tube 35. As shown at the right hand portion of FIG. 3 and in FIGS. 4 and 5, a plurality of holders, designated generally by the numeral 33, are mounted to the chain 25, and as the chain 25 moves, the holders 33 move through a first slot 36 (FIGS. 4 and 6) that has a rectilinear configuration and that extends longitudinally along the tube 35.

As the chain 25 moves further, the holders 33 pass through a magnetic supply bin 37 that may be considered the first stage of the overall apparatus of FIG. 3. The bin 37 horizontally suspends a plurality of the sealed contacts 11 having leads 12 to be solder coated. (For a more detailed description of such a bin, see D. L. Booz and F. J. Brown, "Magnetic Parts Feeder Using Linear Chain," Western Electric Technical Digest, No. 21 (January, 1971) and J. E. Beroset et al. U.S. Pat. No. 3,537,580.)

As the chain 25 and the holders 33 pass through the bin 37, the sealed contacts 11 are individually and loosely fed into U-shaped grooves 39 (FIG. 5) of the holders 33. With a sealed contact 11 loosely mounted to each holder 33, the chain 25 and holders 33 pass out of the bin 37 and each loosely mounted contact 11 is moved into rolling contact with the resilient periphery of a seating wheel 43. While the drive sprocket 28, which is mounted opposite the seating wheel 43, backs up the chain 25, the wheel 43 firmly seats each contact 11 into each groove 39 of each holder 33.

Next, the chain 25 moves each sealed contact 11 through a solder and flux applying apparatus, designated generally by the numeral 46 (FIG. 3), that may be considered the second stage of the overall apparatus of FIG. 3. The apparatus 46, which is mounted to the base 31 by any conventional means such as supports 47, applies a mixture of powdered solder and flux to each lead 12 of each seated seal contact 11.

After this mixture has been applied to the leads 12, the chain 25 moves each contact 11 through a heating apparatus, designated generally by the numeral 48, which may be considered the third stage of the overall apparatus of FIG. 3. The heating apparatus 48, which is conventionally mounted to the base 31, melts the solder of the mixture on the leads 12 and thereby forms the layers 19 on the side surfaces 21 and ends 22 of the leads 12.

Next, the chain 25 moves each contact 11 into a cleaning bath, designated generally by the numeral 51, which may be considered the fourth stage of the overall apparatus of FIG. 3. The bath 51 removes any residual flux remaining on the leads 12.

After the cleaning, each contact 11 is moved into a conventional rinsing bath, designated generally by the numeral 52, which may be considered the fifth stage of the overall apparatus of FIG. 3. The bath 52 rinses any of the bath 51 remaining on the leads 12.

Next, the chain 25 moves each contact 11 into a drying chamber, designated generally by the numeral 54, which may be considered the sixth stage of the overall apparatus of FIG. 3. The chamber 54 dries any of the bath 52 that remains on the leads 12.

Finally, the chain 25 moves the article holders 33 and contacts 11 past an inclined, bifurcated stripping member 55 to remove the contacts 11 from the grooves 39 of the holders 33 and to deposit them in a bin 56. The bin 56 may be considered the seventh and final stage of the overall apparatus of FIG. 3.

CONVEYING APPARATUS

Referring now to FIGS. 3–6, the apparatus 26 for conveying the sealed contacts 11 in accordance with the present invention is shown. As is apparent from the above description of the overall apparatus of FIG. 3, the apparatus 26 conueys the contacts 11 through the various stages of such overall apparatus.

Figure 4:
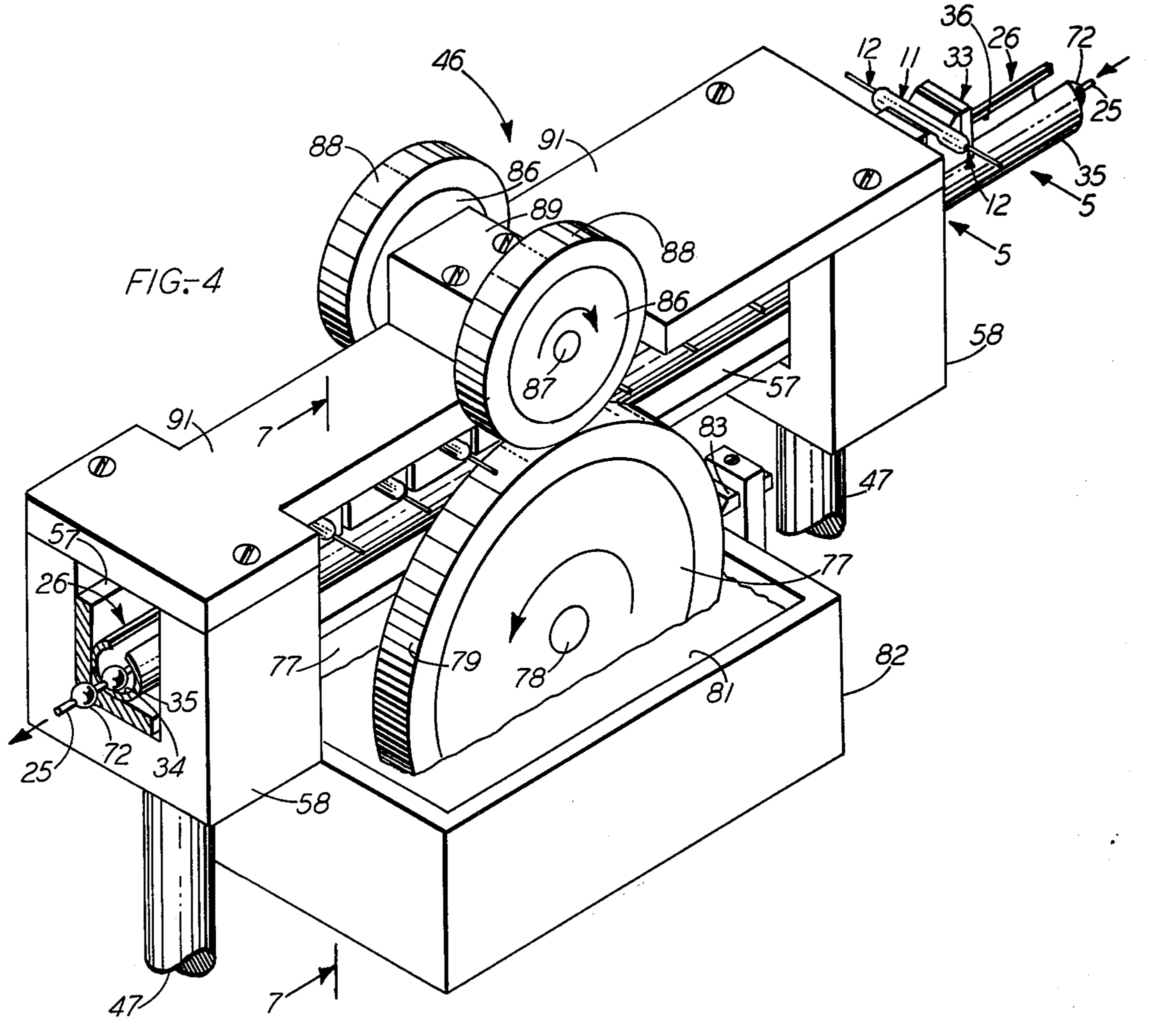
FIG. 4 is a perspective view, partly in section, of an apparatus for conveying sealed contacts to an apparatus for applying a mixture of powdered solder and flux on the side surfaces and ends of the leads of a plurality of the sealed contacts of FIG. 1.

The conveying apparatus 26 includes the tube 35 (FIGS. 4–6) having the bead chain 25 extending through its passageway 34. The tube 35 is supported by conventional expedients, such as a section 57 of angle iron mounted to a pair of yokes 58 fixed to the supports 47, as shown in FIG. 4. The supports 47 are mounted to the base 31, as shown in FIG. 3.

Figure 10:
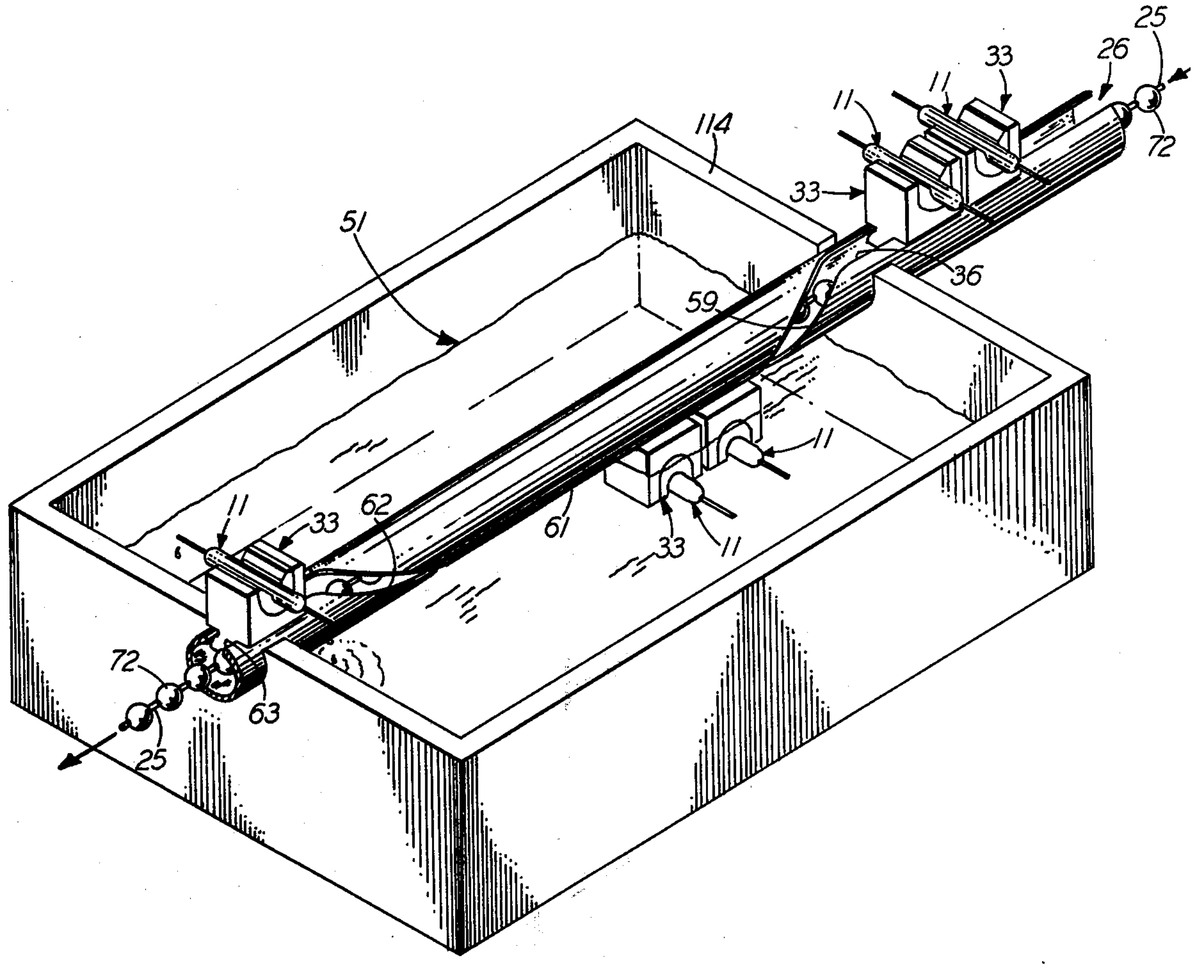
FIG. 10 is a perspective view of an apparatus for positioning the sealed contacts in a cleaning bath and then removing them from the bath.

In addition to the aforementioned first slot 36, the tube 35 has a plurality of other slots as shown in FIG. 10, including a second slot 59 communicating with the first slot 36, a third slot 61 communicating with the second slot 59, a fourth slot 62 communicating with the third slot 61, and finally a fifth slot 63 communicating with the fourth slot 62. While the first, third and fifth slots 36, 61 and 63 have rectilinear configurations, the second and fourth slots 59 and 62 have curvilinear configurations that curve helically about the axis of the tube 35. The slots 36, 59, 61, 62 and 63 coact with the holders 33 mounted to the chain 25 to orient the contacts 11 in various angular positions about the chain 25 and in various longitudinal positions along the tube 35 as the chain 25 advances through the passageway 34 of the tube 35 and through the various stages of the overall apparatus of FIG. 3.

Figure 5:
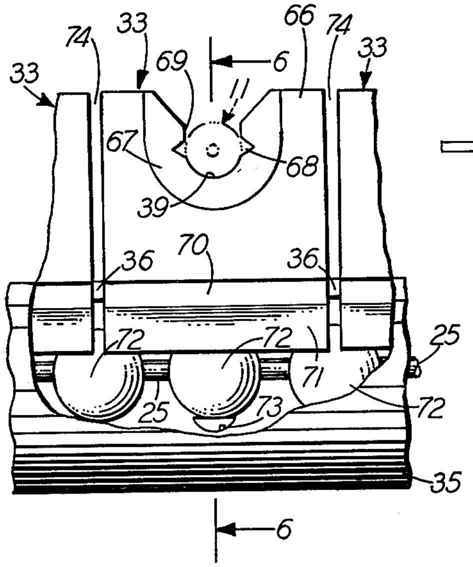
FIG. 5 is an enlarged view, partially cut away, taken along lines 5—5 of FIG. 4, showing a bead chain passing through a passageway of a tube of the conveying apparatus of FIG. 4, and the manner in which a plurality of sealed contact holders are fixed to the chain.
Figure 6:
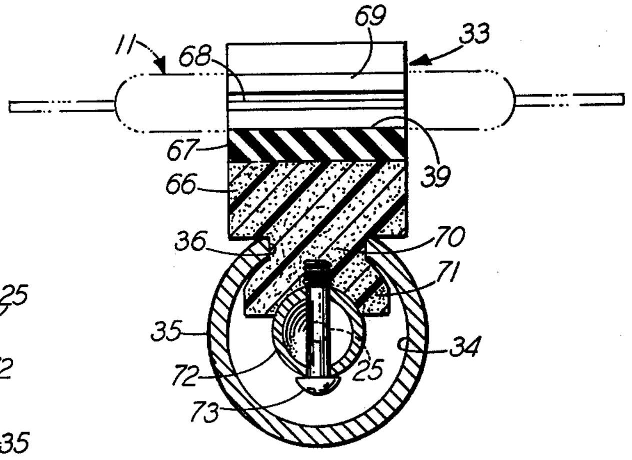
FIG. 6 is a sectional view taken along lines 6—6 of FIG. 5, showing the manner in which a sealed contact holder slides along a slot of the tube of FIG. 5.

FIGS. 5 and 6 illustrate in greater detail the configuration of the holders 33 and the manner in which they are mounted to the chain 25. Each holder 33 includes a head portion 66 having a resilient lining 67 formed into the U-shaped groove 39 for holding one of the contacts 11. Advantageously, a pair of opposed internal notches 68 may be formed on the opposite walls of the groove 39 to form a pair of locking edges 69 to more securely hold each contact 11 after it has been seated by the wheel 43 (FIG. 3).

Each holder 33 also has a grooved or neck portion 70 (FIG. 6) extending from the head portion 66 and in slidable engagement with the slot 36, shown in FIGS. 5 and 6 and the slots 59, 61, 62 and 63 shown in FIG. 10. Additionally, each holder 33 has a pair of shoulders 71 extending from the neck portion 70 and having a curvilinear cross-section substantially similar to that of the passageway 34 of the tube 35 and in slidable engagement with a portion of the interior walls of the passageway 34.

Figure 8:
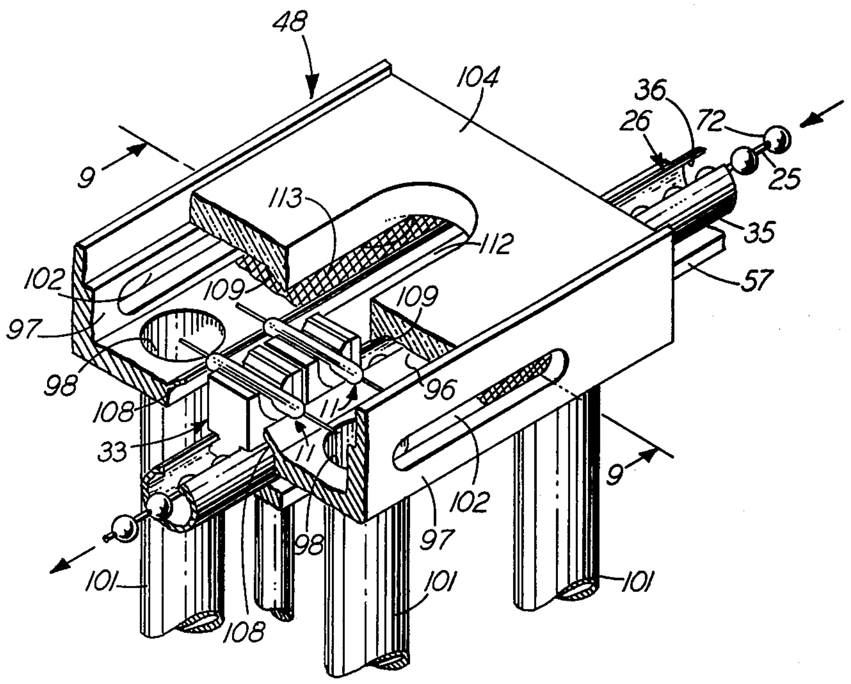
FIG. 8 is a perspective view of an apparatus for heating the leads of the sealed contacts to melt the solder of the mixture that has been coated on the leads with the apparatus of FIGS. 4 and 7 to thereby form layers of solder on the leads.

Each holder 33 is fixed to one of a plurality of spaced beads 72 (FIGS. 5 and 6) of the endless chain 25 by any conventional fastening means, such as a threaded member 73. By so fixing each holder 33, a slight space 74 (FIG. 5) is established between all the holders 33. While FIGS. 4, 8 and 10 illustrate only several of the spaced holders 33 serially fixed to the beads 72 of the chain 25, it is to be understood that the holders 33 may be continuously fixed to the entire endless chain 25 so that all the holders 33 have the same space 74 between them.

The beads 72 are freely rotatable about the longitudinal axis of the chain 25. Hence, the holders 33 are movable not only longitudinally along the tube 35 but also rotatably about the chain 25 to various angular positions by the camming action of the curvilinear slots 59 and 62 (FIG. 10) as the chain 25 is advanced through the passageway 34.

Preferably, the holders 33 are formed of a material that has a low coefficient of friction so as to slide easily along the tube 35. One such material is a graphite filled polyimid plastic.

SOLDER AND FLUX APPLYING APPARATUS

Figure 7:
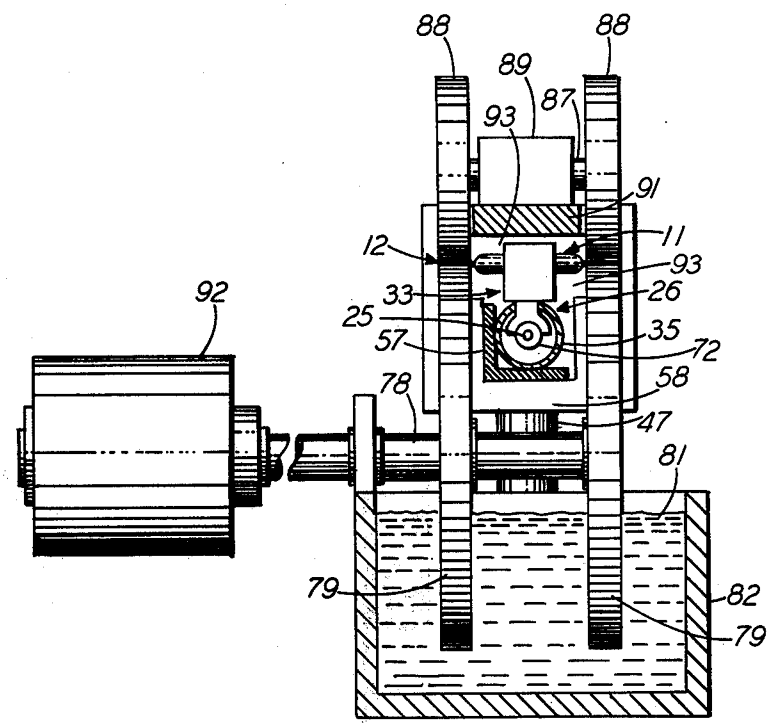
FIG. 7 is a sectional view taken along lines 7—7 of FIG. 4, showing the manner in which the sealed contacts pass through a space formed by a plurality of coating wheels of FIG. 4.

Attention is now directed to FIGS. 4 and 7 where the solder and flux applying apparatus 46 is shown. The chain 25 of the conveying apparatus 26 moves each contact 11 held by each holder 33 along, and oriented above, the tube 35 to the solder and flux applying apparatus 46. This movement is in the direction shown by the arrows of FIG. 4. Each contact 11 successively enters the solder and flux applying apparatus 46.

The apparatus 46 includes a first pair of identical coating wheels 77 (FIGS. 4 and 7) axially secured to a shaft 78 and spaced apart a distance slightly exceeding the length of the glass envelope 13 of each contact 11. Each wheel 77 has a resilient peripheral surface 79, formed of silicone cellular rubber or the like. Each wheel 77 is mounted to rotate partially within a bath 81 held by a tank 82 secured to the base 31 with conventional facilities (not shown). The bath 81 is a viscous mixture of powdered solder and flux. Stirring facilities (not shown) may be mounted in the bath 81 to keep the mixture substantially uniform. Advantageously, the solder may be a powdered alloy of 60 percent tin and 40 percent lead mixed with a water soluble flux of ammonium chloride, zinc chloride and ammonium fluoride. Such a mixture is sold by Alpha Metals, Inc. under the trade designation "Alpha Solder Cream No. 2638."

The apparatus 46 also includes a second pair of identical coating wheels 86 axially secured to a shaft 87 and having resilient peripheral surfaces 88 mounted so that these surfaces 88 engage the surfaces 79 of the first pair of coating wheels 77. The surfaces 88, like the surfaces 78, may be formed of silicone cellular rubber or the like. The shaft 87 is freely rotatable in a housing 89 fixed to a plate 91 that is mounted to the base 31 with the yokes 58 and the supports 47.

A conventional rotating device, such as a motor 92 (FIG. 7), is coupled to the shaft 78 of the first pair of wheels 77 and is conventionally mounted to the base 31 with appropriate facilities (not shown). The motor 92 rotates the first pair of wheels 77 to rotate therewith the second pair of wheels 86. This rotation of the wheels 77 and 86 coats their peripheral surfaces 79 and 88 with the mixture of the bath 81. A doctor blade 83 (FIG. 4), adjustably mounted to the tank 82 with conventional expedients, controls the thickness of the coating on the surfaces 79 of the wheels 77, and therefor the thickness of the coatings on the surfaces 88 of the wheels 86.

As each contact 11 enters the solder and flux applying apparatus 46 under the control of the chain 25, each contact 11 successively passes into a space 93 (FIG. 7) defined by both pairs of coating wheels 77 and 86. Next, the leads 12 simultaneously engage the peripheral surfaces 79 and 88 of the wheels 77 and 86 to compress them and to simultaneously apply the mixture of the bath 81 to the side surfaces 21 and the ends 22 of the leads 12. It should be noted that there is virtually no slippage of the leads 12 relative to the surfaces 79 and 88 as these surfaces 79 and 88 apply the mixture to the leads 12.

After the mixture has been applied to the leads 12 of each 11, each contact 11 is moved by the chain 25 out of the space 93, beyond the coating wheels 77 and 86 and out of the solder and flux applying apparatus 46.

Controlling the thickness of the mixture on the leads 12, and the thickness of the layers 19 subsequently formed thereon, are (1) the thickness of the mixture on the surfaces 79 of the wheels 77, (2) the viscosity of the mixture, and (3) the speed of the wheels 77.

HEATING APPARATUS

Figure 9:
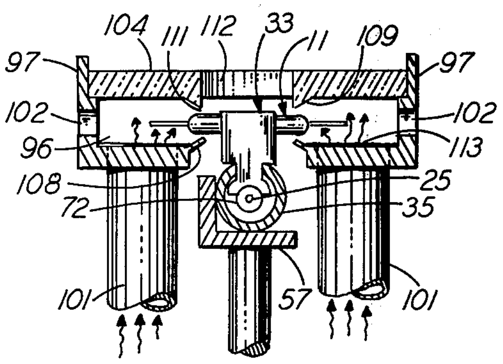
FIG. 9 is a sectional view taken along lines 9—9 of FIG. 8 showing in greater detail the baffle arrangement of the heating apparatus of FIG. 8, which prevents excessive heating of the sealed contacts and conveying apparatus.

After the chain 25 of the conveying apparatus 26 moves each contact 11 out of the solder and flux applying apparatus 46, the chain 25 continues to move each contact 11 along, and oriented above, the tube 35 to the heating apparatus 48 of FIGS. 8 and 9. This movement is in the direction indicated by the arrows in FIG. 8. Each contact 11 successively enters the heating apparatus 48.

The heating apparatus 48 includes a pair of heat tunnels 96 spaced apart a distance slightly greater than the length of the glass envelope 13 of each contact 11. The heat tunnels 96 are constructed of a pair of parallel L-shaped channels 97 which have a plurality of apertures 98 aligned in a single row in each base portion of each channel 97. Through these apertures 98 hot gases are forced from a plurality of conventional heat guns 101 to the heat tunnels 96. The heat guns 101 may be those sold by Sylvania under the trade designation "Flameless Electric Torch, Series III."

Each side wall of each channel 97 also has a plurality of slots 102 through which the hot gases are exhausted from the heat tunnels 96. While the gases may be any of a variety of different gases, as a matter of convenience the gases are simply those contained in air or air itself.

The heat tunnels 96 are also constructed of a top plate 104 removably mounted to the top edges of the side walls of the channels 97. The plate 104 is preferably formed of a transparent heat resistant material such as quartz or the like.

A first pair of baffles 108 is formed at the inner edges of the base portions of each channel 97. A second pair of baffles 109 is formed on the inner surface of the top plate 104 opposite to the first pair of baffles 108. These pairs of baffles 108 and 109 coact to form a pair of slots 111 (FIG. 9) through which each lead 12 to be heated passes. The baffles 108 and 109 also minimize the flow of hot gases to the envelopes 13 of the contacts 11 and their holders 33. A slot 112 is provided in the top plate 104 for exhausting any hot gases that escape through the baffles 108 and 109 to the vicinity of the envelopes 13 and the holders 33.

As each contact 11 enters the heating apparatus 48 under the control of the chain 25, the terminal portions 16 of the leads 12 pass through the slots 111 and the heat tunnels 96; whereupon, the mixture of the bath 81 on these terminal portions 16 is heated by the hot gases passing through the tunnels 96. The heating of the portions 16 melts the powdered solder and vaporizes some of the flux of the mixture. Most of the vaporized flux is exhausted through the slots 102 along with the exhausted hot gases. A screen 113 is advantageously positioned over the apertures 98 to prevent any molten solder or flux on the leads 12 from falling into the heat guns 101.

After the solder melts, the chain 25 successively moves each contact 11 out of the heating apparatus 48. Then, the molten solder cools to form the layers 19 on the side surfaces 21 and ends 22 thereof, as shown in FIG. 2, with thicknesses as previously described.

CLEANING AND RINSING BATHS

After the chain 25 of a conveying apparatus 26 moves each contact 11 out of the heating apparatus 48, the chain 25 continues to move each contact 11 along, and oriented above, the tube 35 to the cleaning bath 51 of FIG. 10. This movement is in the direction indicated by the arrows in FIG. 10.

As each contact 11 is moved by the chain 25 along the tube 35, the neck portion 70 of each holder 33 slides along the rectilinear slot 36. This sliding action along the slot 36 maintains the contacts 11 oriented above the tube 35. Also, this action occurs as the contacts 11 are moved through the solder and flux applying apperatus 46, the heating apparatus 48, and over a first side wall 114 of a tank (appropriately mounted to the base 31) holding the bath 51.

After each contact 11 moves over the wall 114, continued advancement of the chain 25 slides the neck portion 70 of each holder 33 into engagement with the second curvilinear slot 59. Then, the chain 25 slides the neck portion 70 along this slot 59. This sliding action produces a camming of each holder 33 to move to rotate each contact 11 about the chain 25.

This rotatable movement is through an angle of approximately 180° and results in the immersion of each contact 11 and part of the head portion 66 into the bath 51. It should be understood, however, that it is within the spirit and scope of this invention to effectuate radial movement through angles other than 180. Simultaneous with the radial movement, each contact 11 is also moved by the chain 25 longitudinally along the tube 35.

Continued advancement of the chain 25 slides each neck portion 70 of each holder 33 beyond the slot 59 and into engaement with the third rectlinear slot 61. Then, the chain 25 slides the neck portion 70 along this slot 61 to longitudinally move each contact 11 along the tube 35 and through the bath 51. Advantageously, the bath 51 is a heated, ultrasonically agitated flux solvent, such as water or the like. The bath 51 removes any residual flux remaining on the leads 12 of the contacts 11.

It should be noted that neither the chain 25, nor the tube 35, nor the shoulders 71 and neck portions 70 of the holders 33 are immersed in the bath 51. Hence, these elements are not damaged by the bath 51 and do not tend to increase the contaminants thereof. Moreover, the tube 35 tends to protect the chain 25 and its lubricants from the bath 51, its fumes, and the other treating mediums of the overall apparatus of FIG. 3.

Further advancement of the chain 25 slides the neck portion 70 of each holder 33 into engagement with the fourth curvilinear slot 62 to longitudinally move each contact 11 along the tube 35 and to rotate each contact 11 out of the bath 51. Still further advancement of the chain 25 slides the neck portion 70 into engagement with the fifth rectilinear slot 63, resulting in moving each contact 11 longitudinally along the tube 35 and rotating each contact 11 out of the bath 51.

In the same manner that each contact 11 is rotated into the bath 51, moved longitudinally along the tube 35 in the bath 51, and then rotated out of the bath 51; each contact 11 is similarly positioned within the rinsing bath 52. The bath 52, which may be of a solvent such as water, rinses any of the bath 51 remaining on the leads 12 of the contacts 11.

DRYING CHAMBER

After the chain 25 of the conveying apparatus 26 moves each contact 11 out of the rinsing bath 52, the chain 25 moves each contact 11 along, and oriented above, the tube 35 to the drying chamber 54 of FIG. 3. This chamber 54 dries any solvent from the bath 52 remaining on the contacts 11 and their leads 12. At this stage, the movement of the contacts 11 is in the direction shown by the arrows of FIG. 3.

Each contact 11 successively passes through the chamber 54 where jets of dry gases, such as those contained in air or air itself, are forced under pressure against the contacts 11 and their leads 12. This removes and dries substantially all the solvent of the bath 52 that remained on the contacts 11 and their leads 12 as they left the bath 52.

After the chain 25 moves the contacts 11 out of the drying chamber, the chain 25 moves each holder 33 and the contact 11 therein past the inclined, bifurcated stripping member 55. This results in the removal of the contacts 11 from the grooves 39 of the holder 33 and the depositing of the contacts 11 with the layers 19 on the leads 12 into the bin 56.

Hence, the apparatus of the present invention has formed the layers 19 of solder on the side surfaces 21 and ends 22 of the leads 12 of the contacts 11. These layers 19 not only protect the leads 12 from contamination but also enhance their solderability into circuits.

The layers 19, which may have a different thickness on the ends 22 than on the side surfaces 21, have a substantially uniform thickness on these ends 22 and surfaces 21. Further, the apparatus of the present invention minimizes any bending of the leads 12. This greatly facilitate the subsequent handling of the contacts 11 with automatic equipment.

The apparatus of the present invention also eliminates problems associated with plating over contaminants on the leads 12. This, of course, enhances the solderability of the leads 12 into circuits. The apparatus of the present invention also minimizes processing damage to the contacts such as thermoshock to the glass envelopes 13 thereof. It also minimizes problems associated with subjecting the processing apparatus to various treating mediums such as hot gases and cleaning baths to reduce both the damage to the apparatus as well as any contamination resulting from the apparatus passing through the mediums.

Further, the apparatus of the present invention removes any residual flux from the leads 12 that may interfere with subsequent electrical contact to the leads 12. In so removing this flux as well as advancing the contacts 11 to various stages of the apparatus of the present invention, both longitudinal and angular control the leads 12 through the stages is effectuated with a simple mechanism that minimizes article handling.

Significantly, the apparatus of the present invention effectuates the solder coating of the leads 12 of the contacts 11 at great speeds, with an output of about 21,000 of the contacts 11 per hour.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. An apparatus for forming layers of a fusible metal on articles, comprising:

an elongated member forming an enclosure and having a surface and a slot formed in the surface and extending longitudinally along the member;

a strand-like member extending within the enclosure;

means for applying on each article a mixture of the metal and a flux;

means connected to the strand-like member and passing through the slot, including grooved portions supported by and engaging the edges of such slot, for mounting each article to the strand-like member;

means for heating at least the fusible metal of the mixture to melt it; and means for advancing the strand-like member along the elongated member to move the mounting means longitudinally along the slot to convey each article through the applying means to apply the mixture on each article, and to convey each article with the mixture thereon through the heating means to melt at least the fusible metal of the mixture and thereby form the layers of the fusible metal on the articles.

2. An apparatus for forming layers of a fusible metal on articles, comprising:

an elongated member having a curvilinear outer surface, a longitudinally extending enclosure, and a rectilinear slot formed on the outer surface of the elongated member and extending longitudinally therealong;

a strand-like member extending through the enclosure of the elongated member;

means for applying on each article a mixture of the fusible metal and a flux;

means connected to the strand-like member and passing through the slot, including grooved portions supported by and engaging the edges of such slot, for mounting each article to the strand-like member;

means for heating the fusible metal of the mixture to melt it; and means for advancing the strand-like member through the enclosure of the elongated member to move the mounting means longitudinally along the slot to convey each article through the applying means to apply the mixture on each article, and to convey each article with the mixture thereon through the heating means to melt the fusible metal of the mixture and thereby form the layers of the fusible metal on the articles.

3. The apparatus of claim 2, further comprising a treating medium for removing any residual flux from the articles after the metal has been applied, wherein the elongated member also has a curvilinear slot communicating with the rectilinear slot and traversing the axis of the elongated member, wherein the article mounting means passes sequentially through both the rectilinear and curvilinear slots and is sequentially supported by and sequentially engages the edges of both slots and movably mounts each article to the strand-like member, and wherein the mounting means moves both longitudinally and rotatably about the strand after the layer has been formed on each article to both rotate and translate each article into the treating medium to remove any residual flux therefrom.

4. The apparatus of claim 3, wherein the treating medium is a heated, ultrasonically vibrated water bath.

5. The apparatus of claim 2, wherein the strand-like member is an endless bead chain.

6. The apparatus of claim 2, wherein the fusible metal is a solder.

7. An apparatus for solder coating wire-like members, comprising:

a first coating wheel having a resilient peripheral surface and being mounted to partially rotate in a bath of a viscous mixture of solder powder and flux to coat the surface therewith;

a second coating wheel having a resilient peripheral surface mounted so that its peripheral surface engages that of the first wheel;

means for rotating the first wheel to rotate the second wheel therewith and to coat with the mixture the resilient peripheral surfaces of the first and second wheels;

a tube having a curvilinear outer surface, a longitudinally extending passageway, a rectilinear slot formed on the outer surface of the tube and extending longitudinally therealong;

a strand-like member extending through the passageway of means for fixedly holding each wire-like member;

means connected to the strand-like member and passing through the slot, including grooved portions supported by and engaging the edges of such slot, for mounting the holding means to the strand-like member;

a heat tunnel for heating each wire-like member;

a plurality of heat guns for forcing a heated gas through the heat tunnel; and means for advancing the strand-like member through the passageway of the tube to move the holding means longitudinally along the slot to convey each wire-like member into simultaneous contact with the first and the second wheel to compress their resilient peripheral surfaces and to simultaneously coat each wire-like member with the viscous mixture without rotating each wire-like member about its axis, and to convey each coated wire-like member through the heat tunnel to melt the mixture and thereby solder coat each wire-like member.

8. An apparatus for solder coating wire-like members, comprising:

a first coating wheel having a resilient peripheral surface and being mounted to partially rotate in a bath of a viscous mixture of solder powder and flux to coat the surface therewith;

a second coating wheel having a resilient peripheral surface mounted so that its peripheral surface engages that of the first wheel;

means for rotating the first wheel to rotate the second wheel therewith and to coat with the mixture the resilient peripheral surfaces of the first and second wheels;

a tube having a curvilinear outer surface, a longitudinally extending passageway, a first rectilinear slot formed on the outer surface of the tube and extending longitudinally therealong, a curvilinear slot also formed in the outer surface of the tube and curving helically about the axis of the passageway, and a second rectilinear slot also formed in the outer surface of the tube and extending longitudinally therealong, the curvilinear slot joining the rectilinear slots;

a bead chain extending through the passageway of the tube;

means for fixedly holding each wire-like member;

means connected to the bead chain and passing through the slots, including grooved portions supported by and engaging the edges of such slot, for movably mounting the holding means to the bead chain;

a heat tunnel for heating each wire-like member;

a plurality of heat guns for forcing heated gas through the heat tunnels;

a bath for removing any residual flux from the wire-like members;

means for advancing the bead chain through the passageway of the tube to move the holding means longitudinally along the slots to convey;

each wire-like member into simultaneous contact with the first and second wheels to compress their resilient peripheral surface and to simultaneously coat each the wire-like member with the viscous mixture without rotating the wire-like member through the heat tunnels to melt the mixture and solder coat each wire-like member;

each solder coated wire-like member along the elongated member and rotably about the bead chain member to position each wire-like member in the cleaning bath to remove substantially the residual flux; and each cleaned, solder coated wire-like member along the tube and rotatably about the bead chain to position each wire-like member out of the cleaning bath.

9. An apparatus for coating wire-like members with a fluidic substance, comprising:

a first coating wheel having a resilient peripheral surface and being mounted to rotate partially within a bath of the substance to coat the surface therewith;

a second, freely rotatably mounted, coating wheel having a resilient peripheral surface mounted so that its peripheral surface engages that of the first wheel;

means for rotating the first wheel to rotate the second wheel therewith and to coat with the substance the resilient peripheral surfaces of the first and second wheels; and means for conveying each wire-like member into simultaneous contact with the first and the second coating wheels with the axis of each wire-like member being substantially parallel with the axes of the wheels and without rotating the wire-like member about is axis to compress their resilient peripheral surfaces and to simultaneously coat with the substance the side surfaces and ends of each wire-like member.

10. The apparatus of claim 9, wherein the fluidic substance is a fusible material mixed with a flux to form a viscous liquid, and wherein the end of each wire-like member is positioned between the surfaces of the coating wheels upon the contacting of such members with such surfaces.

11. An apparatus for simultaneously coating a pair of leads extending axially from each end of an elongated body, which comprises:

a first pair of axially mounted, identical coating wheels spaced apart a distance slightly greater than the length of the elongated body and having resilient peripheral surfaces and being mounted to rotate partially within a bath of a viscous liquid to coat the surfaces therewith;

a second, freely rotatably mounted, pair of axially mounted, identical coating wheels having resilient peripheral surfaces mounted so that their peripheral surfaces engage those of the first pair of wheels;

means for rotating the first pair of wheels to rotate the second pair of wheels therewith and to coat with the liquid the resilient peripheral surfaces of the first and the second pair of wheels; and means for conveying each elongated member into the space between the pairs of wheels, and for conveying the leads into simultaneous contact with the peripheral surfaces of the first and second pairs of wheels with the axis of each lead being substantially parallel with the axes of the wheels and without rotating the leads about their axis to compress such surfaces and to simultaneously coat with the liquid the side surfaces of the leads.

12. The apparatus of claim 11, wherein the conveying means comprises:

a tube having curvilinear outer surface, a longitudinally extending passageway, and a rectilinear slot formed on the outer surface of the elongated member and extending longitudinally therealong;

a bead chain extending through the passageway of the tube;

means for fixedly holding the elongated body;

means passing through the rectilinear slot for mounting the body holding means to the bead chain; and means for advancing the bead chain longitudinally through the passageway of the tube to move the body holding means longitudinally along the slot to convey the leads into simultaneous contact with first and second pairs of wheels without rotating the leads to compress their resilient peripheral surfaces and to simultaneously coat with the substance the side surfaces of the leads.

13. The apparatus of claim 11, wherein the elongated bodies are sealed contacts.

* * * * *

UNITED STATES PATENT OFFICE
CERTIFICATE OF CORRECTION

Patent No. 3,882,816 Dated May 13, 1975

Inventor(s) David L. Booz, Ford J. Brown and Richard J. Merwarth

It is certified that error appears in the above-identified patent and that said Letters Patent are hereby corrected as shown below:

The Inventor David L. Rooz should be David L. Booz.

Column 5, line 30, "conueys" should be --conveys--.

Column 8, lines 60, 61 and 62 "radial" should be --rotatable--;

line 66, "engaement" should be --engagement--;

Claim 7, line 56, after "way of" insert --the tube--.

Signed and Sealed this

*fourteenth* Day of *October 1975*

[SEAL]

*Attest:*

RUTH C. MASON
*Attesting Officer*

C. MARSHALL DANN
*Commissioner of Patents and Trademarks*